US 6,657,241 B1

(12) United States Patent
Rouse et al.

(10) Patent No.: US 6,657,241 B1
(45) Date of Patent: *Dec. 2, 2003

(54) ESD STRUCTURE HAVING AN IMPROVED NOISE IMMUNITY IN CMOS AND BICMOS SEMICONDUCTOR DEVICES

(75) Inventors: Mark W. Rouse, Santa Clara, CA (US); Andrew Walker, Mountain View, CA (US); Brenor Brophy, San Jose, CA (US); Kenelm Murray, Sunnyvale, CA (US)

(73) Assignee: Cypress Semiconductor Corp., San Jose, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 33 days.

(21) Appl. No.: 09/058,549

(22) Filed: Apr. 10, 1998

(51) Int. Cl.[7] ............... H01L 29/72; H01L 31/119; H01L 31/113; H01L 29/76
(52) U.S. Cl. ............... 257/173; 257/174; 257/297; 257/328; 257/355; 257/357; 257/358; 257/360; 257/363; 257/546; 257/659
(58) Field of Search ............... 257/659, 355, 257/173, 174, 297, 328, 357, 358, 360, 363, 546

(56) References Cited

U.S. PATENT DOCUMENTS

| 4,288,804 A | * | 9/1981 | Kikuchi et al. ............... 357/42 |
| 4,327,368 A | | 4/1982 | Uchida ............... 357/42 |
| 4,571,505 A | | 2/1986 | Eaton, Jr. ............... 307/297 |
| 4,647,956 A | | 3/1987 | Shrivastava et al. ............... 357/42 |

(List continued on next page.)

FOREIGN PATENT DOCUMENTS

| EP | 0170268 | 7/1985 | ............ H01L/23/50 |
| EP | 0 175 152 | 8/1985 | |
| EP | 0 278 065 | 11/1987 | |
| EP | 0283046 | 3/1988 | ............ H01L/23/56 |
| EP | 0449093 | 3/1991 | ............ H01L/27/02 |
| EP | 0622834 | 2/1994 | ......... H01L/21/336 |

OTHER PUBLICATIONS

The Authoritative Dicitionary of IEEE Standards Terms, (Seventh Edition) pp. 1165,1151.*

United States Statutory Invention Registration, Reg. No. H707, Published Nov. 7, 1989, By Hu et al. Cypress Data Book CD–ROM, Winter 1997 S. (5 pages) F. Summer 1996.

(List continued on next page.)

*Primary Examiner*—Wael Fabmy, Jr.
*Assistant Examiner*—Shrinivas H. Rao
(74) *Attorney, Agent, or Firm*—Christopher P. Maiorana, P.C.

(57) ABSTRACT

A semiconductor device includes a grounded-gate n-channel field effect transistor (FET) between an I/O pad and ground ($V_{ss}$) and/or $V_{cc}$ for providing ESD protection. The FET includes a tap region of grounded p-type semiconductor material in the vicinity of the $n^+$-type source region of the FET, which is also tied to ground, to make the ESD protection device less sensitive to substrate noise. The p-type tap region comprises either (i) a plurality of generally bar shaped subregions disposed in parallel relation to $n^+$ source subregions, or, (ii) a region that is generally annular in shape and surrounds the n+ source region. The p-type tap region functions to inhibit or prevent snapback of the ESD device, particularly inadvertent conduction of a parasitic lateral npn bipolar transistor, resulting from substrate noise during programming operations on an EPROM device or in general used in situations where high voltages close to but lower than the snapback voltage are required in the pin.

23 Claims, 3 Drawing Sheets

U.S. PATENT DOCUMENTS

| | | | |
|---|---|---|---|
| 4,651,190 A | 3/1987 | Suzuki et al. | 357/45 |
| 4,660,067 A | 4/1987 | Ebina | 357/42 |
| 4,670,668 A | 6/1987 | Liu | 307/296 R |
| 4,757,363 A * | 7/1988 | Bohm et al. | 357/23.13 |
| 4,862,415 A | 8/1989 | Nakano | 365/189.09 |
| 4,922,367 A | 5/1990 | Hidaka | 361/58 |
| 4,937,645 A | 6/1990 | Ootsuka et al. | 357/42 |
| 5,055,903 A | 10/1991 | Wichmann | 357/42 |
| 5,159,204 A | 10/1992 | Bernacchi et al. | 307/200 B |
| 5,379,174 A | 1/1995 | Kasamoto | 361/56 |
| 5,384,477 A | 1/1995 | Bulucea et al. | 257/372 |
| 5,406,513 A | 4/1995 | Canaris et al. | 365/181 |
| 5,440,162 A * | 8/1995 | Worley et al. | 257/355 |
| 5,441,900 A | 8/1995 | Bulucea et al. | 437/24 |
| 5,527,724 A | 6/1996 | Brady et al. | 437/24 |
| 5,570,043 A * | 10/1996 | Churchill | 326/81 |
| 5,623,156 A * | 4/1997 | Watt | 257/355 |
| 5,728,612 A * | 3/1998 | Wei et al. | 438/200 |
| 5,953,190 A | 9/1999 | Rees et al. | 361/56 |

OTHER PUBLICATIONS

Capacitive Coupling of Floating Body Well to Sensitive Nodes Prevents High–Resistance CMOS Circuit From Latching–Up, By M. Bafleur et al., Electronics Letters Jun. 22nd, 1989, vol. 25, No. 13, pp. 860–861.

Preventing latch–up in CMOS DACs, By Mark Alexander, Electronic Product Design, Feb. 1989, pp. 91–95.

Mixed–Voltage Interface ESD Protection Circuits For Advanced Microprossors In Shallow Trench and LOCOS Isolation CMOS Technologies, By Steven H. Voldman et al., 1994 IEEE, pp. 10.3.1–10.3.4.

CMOS Technologies for Logic Applications, By H. Mingam, Microelectronic Engineering 15 (1991), pp. 243–251.

Improving the ESD Failure Threshold of Silicided nMOS Output Transistors by Ensuring Uniform Current Flow, By T. Polgreen et al., 1989 EOS/ESD Symposium Proceedings, pp. 167–174.

Preventing latchup in CMOS DACs, By Mark Alexander, Electronic Product Design, Feb. 1989, pp. 91–95.

Peter Voss et al., U.S.S.N. 08/933,562, Method and Apparatus to Prevent Latch–up in CMOS Devices, filed Sep. 19, 1997.

Preventing Latchup in CMOS DACs, By Mark Alexander, PCIM, Nov. 1988, pp. 54–59.

On–Chip Decoupling Capacitor Design to Reduce Switching–Noise–Induced Instability in CMOS/SOI VLSI, By L.K. Wang et al., Proceedings 1995 IEEE International SOI Conference, Oct. 1995, pp. 100–101.

An Advanced Submicron CMOS Technology With $2\beta m$ Pitch At All Levels, By M.H. El–Diwany et al., 1987 IEEE (4 pages). pp. 917–920.

Core Clamps For Low Voltage Technologies, By S. Dabral et al., EOS/ESD Symposium 94–142, pp. 3.6.1–3.6.9.

High–energy ion implantation for ULSI, By K. Tsukamoto et al., Nuclear Instruments and Methods in Physics Research B59/60 (1991), pp. 584–591.

New Riverside University Dictionary (3 pages). (1984 Edn.).

"Applications of MeV Ion Implantation in Semiconductor Device Manufacturing", John O. Borland, 1995 Materials Research Society, vol. 354, pp 123–33.

"Characteristics and Operation of MOS Field–Effect Devices", Paul Richman, McGraw–Hill Book Company, 1967, pp 99–120.

"Device Electronics for Integrated Circuits", 2nd Ed., Richard S. Muller and Theodore I. Kamins, John Wiley & Sons, Inc., 1977, pp 454–467.

"Dramatic Increases in Latchup Holding Voltage for Sub–0.5 $\beta m$ CMOS Using Shallow S/D Junctions", Jeffrey Lutze, et al., IEEE vol. 15, No. 11, 11/94.

"High Density and Reduced Latchup Susceptibility CMOS Technology for VLSI", J. Manoliu, et al., IEEE vol. EdL–4, No. 7, 7/83, pp 233–235.

"Materials Processing and Advanced Well Structures Using High Energy Implantation for EPI Replacement", D. Wristers, et al., SPIE, vol. 2635.

"Reduced Ground Bounce and Improved Latch–Up Suppression Through Substrate Conduction", Thaddeus Gabara, IEEE, vol. 23, No. 5, 10/88, pp 1224–1232.

"Structure to Prevent Latch–Up of CMOS Devices", IBM Corp. 1986, IBM Technical Disclosure Bulletin, vol. 28, No. 10, 3/86, p 4277.

* cited by examiner

ESD STRUCTURE HAVING AN IMPROVED NOISE IMMUNITY IN CMOS AND BICMOS SEMICONDUCTOR DEVICES

BACKGROUND OF THE INVENTION

1. Field of Invention

The present invention relates generally to semiconductor devices, and, more particularly, to input/output structures for protecting-devices from electrical transients and having an improved ability to withstand the effects of substrate noise.

2. Description of the Related Art

Substrate noise in semiconductor devices, such as CMOS devices, can have several non-desirable effects. In particular, a common failure mode in semiconductor products of the type that use relatively high voltage pins, such as programming voltage pins $V_{pp}$, is a so-called electrical over stress (EOS) failure. The EOS failure involves abnormal, high-current events which can damage the device and, which is due in some cases to an undesirable turn on and conduction of an electrostatic discharge (ESD) protection structure used in the semiconductor product. One cause of the undesired turn on and conduction of the ESD protection device stems from substrate noise in the vicinity of the ESD device.

In a common ESD device configuration, a grounded-gate n-channel field effect transistor (FET) is used as the primary ESD protection device. The grounded-gate FET has its drain region connected to an input/output pad of the product, and further has its gate and source tied to ground ($V_{ss}$). During normal operation of the device, the FET presents a high-impedance path from the pad to ground. It therefore has no significant effect in the normal operation of the device. However, during ESD events, the grounded-gate FET relies on a so-called "snapback" mechanism to enter a low impedance state to remove excess and often dangerous ESD charge from the critical node. In "snapback" mode, the grounded-gate FET operates as a parasitic lateral npn bipolar transistor to provide the low-impedance path between the I/O pad and ground. Snapback generally occurs when the voltage on the I/O pad increases to a high enough value (e.g., 15 volts for a typical CMOS process) so that the n⁺ drain/p-substrate junction of the FET breaks down. This breakdown, in-effect, provides the lateral npn bipolar transistor with a base current supplied by holes generated by impact ionization near the drain region of the channel. Conduction stops when the ESD charge has been removed. The FET again assumes a high-impedance state.

A problem arises, however, when using such a FET on a programming pin. Although voltages used for normal programming operations (e.g., where $V_{pp}$ may be about 13 volts) are not generally high enough to cause the ESD device (e.g., the grounded-gate FET) to snap back, noise can trigger the FET into snapback. Specifically, substrate noise in the vicinity of the source region can provide the difference needed to put the ESD device in the low impedance, snapback mode. Once the grounded-gate FET snaps back, it will continue to conduct, inasmuch as the holding voltage for the FET in snapback is substantially lower than the applied programming voltage $V_{pp}$. Substantial currents flow, which may result in a catastrophic failure of the semiconductor product.

Accordingly, there is a need to provide an improved input/output structure, particularly an improved ESD protection device, that minimizes or eliminates one or more of the problems as set forth above.

SUMMARY OF THE INVENTION

It is an object of the present invention to provide an input/output structure that improves substrate noise immunity. It is a further object of the present invention to provide an ESD protection device for use on I/O pins which provides improved immunity to undesirable turn on during high voltage data programming operations. It is yet a further object of the present invention to provide an ESD protection device that permits an efficient and compact layout.

To achieve these and other objects, a structure in a semiconductor device comprises (i) a transistor formed in a first region of a first conductivity type, and (ii) a tap region of the first conductivity type. The transistor has a gate, and source and drain regions having a second conductivity type opposite the first conductivity type. The tap region is adjacent to and extends from a selected one of the source and drain regions. The other one of the source and drain regions is connected to an input/output pad, and the selected one of the source and drain regions, the gate, and the tap region are all electrically connected to a common node, preferably $V_{ss}$. The principal involved is to locally tie both the substrate (via the tap region) and the source (in a preferred embodiment) to the same potential. This configuration improves the ability to withstand the effects of substrate noise. The invention does not completely prevent snap-back, but rather increases the threshold at which this effect takes place.

In a preferred embodiment, the first conductivity type is p-type, and the second conductivity type is n-type wherein the tap region may be formed in two different shapes. In the first preferred embodiment, the n⁺ source region comprises a plurality of n⁺ subregions wherein the tap region comprises one or more generally bar shaped subregions disposed in parallel relations relative to the source subregions. In another preferred embodiment, the tap region is generally annular in shape and surrounds the source region.

Devices in accordance with the present invention are less sensitive to substrate noise since the substrate (or well), which preferably is p-type and in which the n-channel ESD protection device is formed, and the source of the ESD protection device, are tied locally, by way of the above-described tap regions, to the same voltage potential. Moreover, in the second preferred embodiment wherein the tap region is generally annular in shape, the placement of the grounded p-type tapping between the source and the gate significantly reduces the ability of the intrinsic lateral npn bipolar transistor to switch on. This effect is also present in the preferred embodiment where the tap region is generally bar shaped, but to a lesser degree. In addition, implementing the present invention requires no changes in the standard fabrication process, which preferably includes CMOS processes. Rather, the present invention may be implemented merely by mask changes, as will become apparent to those of ordinary skill in the art. This invention therefore provides a cost effective solution to the problems described in the Background.

Other objects, features, and advantages of the present invention will become apparent to those of ordinary skill in the art from the following detailed description and accompanying drawings illustrating features of this invention by way of example, but not by way of limitation.

DETAILED DESCRIPTION OF THE PREFERRED EMBODIMENTS

Figure 1:
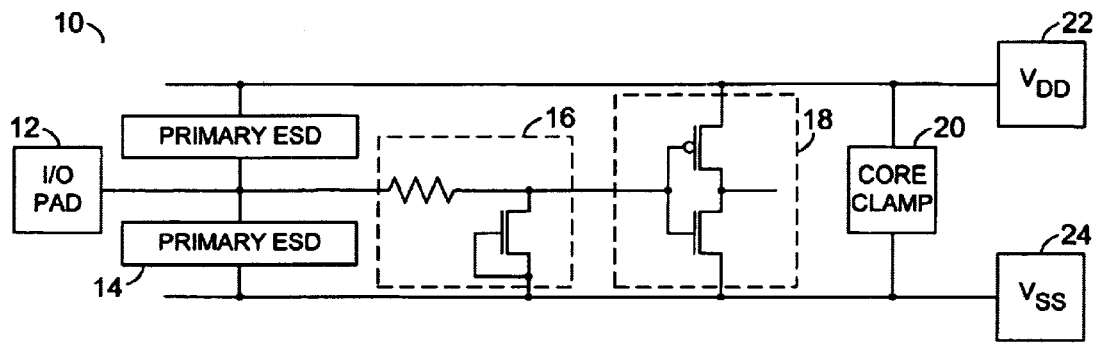
FIG. 1 illustrates an input circuit in accordance with the present invention.

Referring now to the drawings wherein like reference numerals are used to identify identical components in the various views, FIG. 1 shows an input circuit 10 of a semiconductor device according to the present invention. Circuit 10 may include an input, output, and/or input/output pad 12, one or more primary ESD protection circuits 14, a secondary ESD protection circuit 16, an input buffer 18, a core clamp 20, a first bus having a first potential, such as a $V_{dd}$ bus 22, and a second bus having a second potential lower than said first potential, such as a $V_{ss}$ bus 24.

The present invention concerns improvements, generally, to the interface structure corresponding to primary ESD protection circuit 14. Although illustrated in connection with an input circuit of a semiconductor device, the present invention may be employed in other environments such as, for example, output circuits, and input/output circuits, without departing from the spirit and scope thereof. Pad 12, secondary ESD protection circuitry 16, buffer 18, core clamp 20, and power supply busses or rails $V_{dd}$ and $V_{ss}$ may comprise conventional circuitry well known in the art sufficient for purposes of the present invention.

Figure 2:
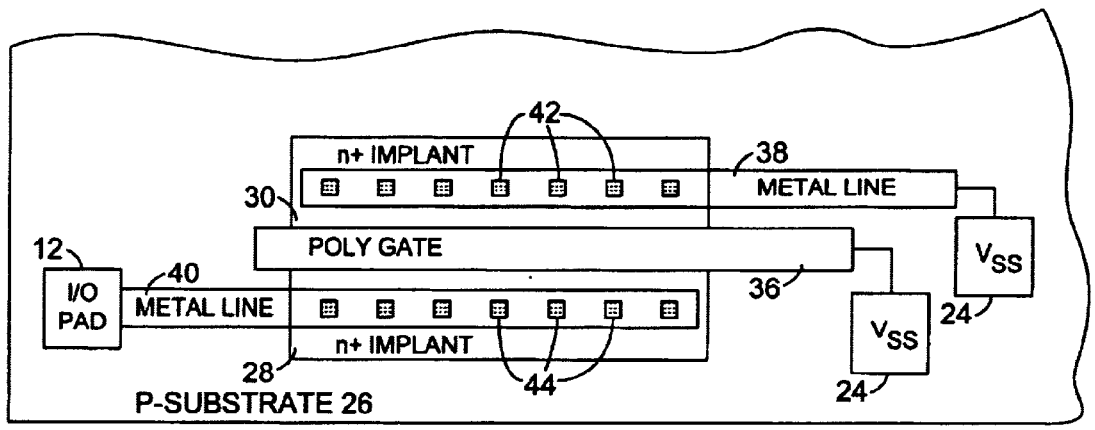
FIG. 2 is a diagrammatic and schematic layout diagram of an ESD protection device, but without the tap regions in accordance with the present invention.

FIG. 2 illustrates a portion of circuit 10 in greater detail, particularly I/O pad 12 and primary ESD circuit 14, but without the improvements to circuit 14 according to the present invention. A conventional primary ESD circuit 14 may comprise a grounded-gate FET, as described in the Background, formed in a first region, such as substrate 26, of a first conductivity type, such as p-type conductivity. As known in the art, the grounded-gate FET may generally take the form of a "multi-fingered" device for area minimization. That is, the single grounded-gate FET shown in the figures of the present application may be but one of a plurality of individual transistors connected in parallel (i.e., gate electrodes tied; source regions tied; drain regions tied). This arrangement is the so-called multi-finger configuration, each FET being a finger. The improvement according to the invention is preferably employed on all "fingers"; however, use on fewer than all the fingers is nonetheless still within the spirit and scope of the invention.

Figure 5:
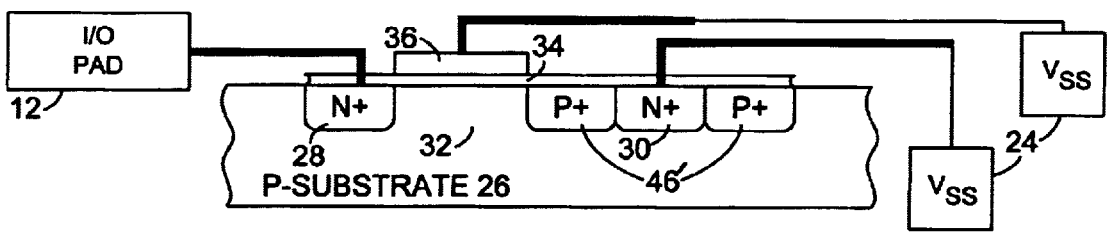
FIG. 5 is a simplified, cross-sectional view taken substantially along lines 5—5 of FIG. 4.
Figure 6:
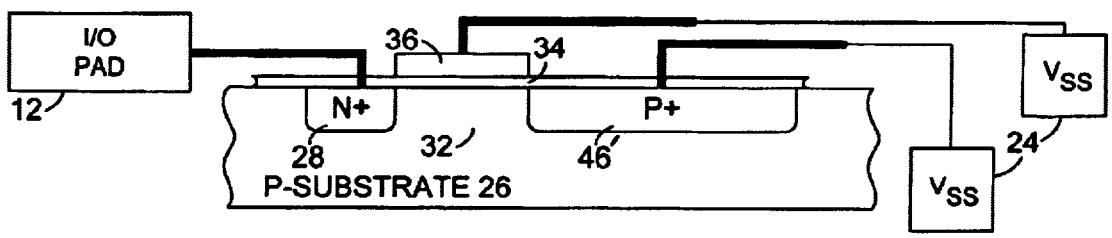
FIG. 6 is a simplified, cross-sectional view taken substantially along lines 6—6 of FIG. 4.

With continued reference to FIG. 2, the grounded-gate FET corresponding to primary ESD protection circuit 14 may further include n$^+$ diffusion regions 28 and 30, which may function as a drain region, and a source region, respectively. As is conventional, the drain region 28 and source region 30 are spaced apart to define a channel region 32 therebetween, as best shown in FIGS. 5 and 6. Also conventional is a layer of dielectric material 34 (best shown in FIGS. 5 and 6) formed over substrate 26, particularly in the area of channel region 32 to form a gate dielectric. The grounded-gate FET may further include a conductive gate electrode 36 ("gate 36") coupled to the $V_{ss}$ bus 24. The FET may yet further include a metal line 38 and a metal line 40 for connecting source region 30 and drain region 28 to the $V_{ss}$ bus 24 and I/O pad 12, respectively. A plurality of contacts 42 and 44 electrically connect source and drain regions 30, 28 to metal lines 38, 40, respectively.

With the foregoing background, and before proceeding to a detailed description of the first and second preferred embodiments referenced to the drawings, the definitions of several terms, as used in this application, will be set forth. A "tap" region refers to a region separately implanted with one or more dopants of the same conductivity type (e.g., p or n) as the surrounding well or substrate. A "diffusion" region refers to a region implanted with one or more dopants of a conductivity type different from the surrounding well or substrate. The term "interface" means any one or more of input, output, input/output, or high-impedance configurations or orientations. The term "common node" means an electrical connection to the nominally same electrical node or potential, and admits of differences in actual potential due to voltage drops, or noise due to separation distances arising from the physical layout. For example, gate 36 and source 30 are both connected to $V_{ss}$; however, different structures are used (polysilicon versus metal) to make such connection so that small differences may in fact exist. The term "adjacent" means, with regard to its use in connection with the term "tap region," that at least a portion of the "tap region" according to the invention is closer to any portion of the nearest structure being referred to (e.g., source region, drain region, etc.) than to any portion of any other of the same reference structure. For example, "adjacent" may mean the distance between the closest edge of tap region 46 (and 46') to the closest edge of the closest source region or subregion, which may be at most 0.65 $\mu$m, more preferably at most 0.5 $\mu$m, even more preferably at most 0.35 $\mu$m–0.25 $\mu$m, and most preferably at most 0.18 $\mu$m (including 0 to 0.18 $\mu$m).

Figure 3:
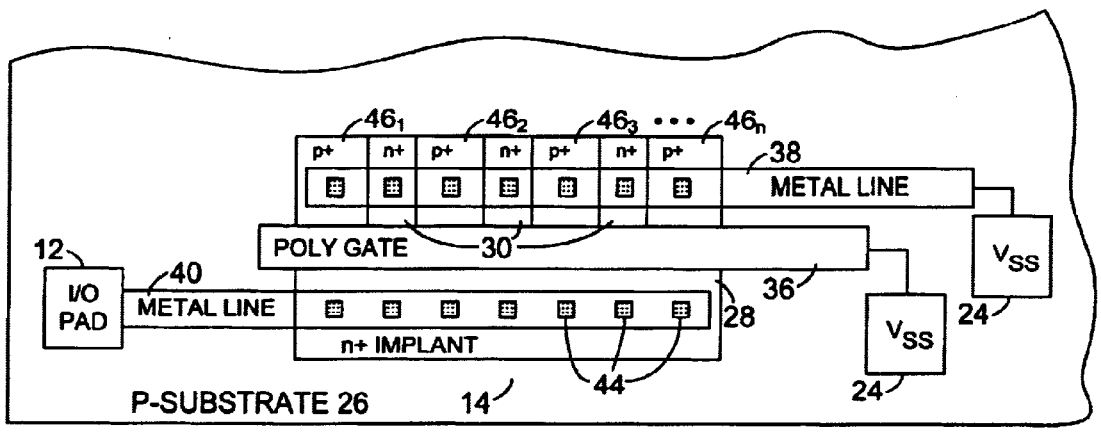
FIG. 3 is a diagrammatic and schematic layout diagram of a first, preferred embodiment according to the invention.

FIG. 3 shows a first preferred embodiment in accordance with the present invention. FIG. 3 is similar to the structure shown in FIG. 2, except that p-type substrate 26 in the vicinity of n$^+$ source 30 is tied to the $V_{ss}$ bus 24 by p$^+$ tap region 46. Tap region 46 is adjacent to and extends from source region 30. In the embodiment illustrated in FIG. 3, source region 30 of one finger comprises a plurality of n$^+$ source subregions wherein p$^+$ tap region 46 comprises a plurality of generally bar shaped subregions $46_1$, $46_2$, $46_3$, ..., $46_n$ disposed in parallel relation to the source subregions 30. The plurality of p$^+$ tap regions $46_1$, $46_2$, ..., $46_n$ rare of the same conductivity type as substrate 26, and thus form ohmic contacts, in effect, to the $V_{ss}$ bus 24 by way of contacts 42 and metal line 38. The base-emitter junction of the parasitic npn bipolar transistor (i.e., p-substrate 26 and n$^+$ source 30) becomes more difficult to turn on for two reasons. First, due to tap region 46, the substrate 26 next to the source 30 is tied locally to the same voltage potential, namely ground potential in the preferred embodiment. This reduces the chance that the parasitic lateral npn bipolar device will turn on during, for example, a customer's programming operation due to substrate noise. Second, portions of tap region 46 extend in the substrate substantially to gate 36. This impairs the ability of the intrinsic npn bipolar from turning on.

Figure 4:
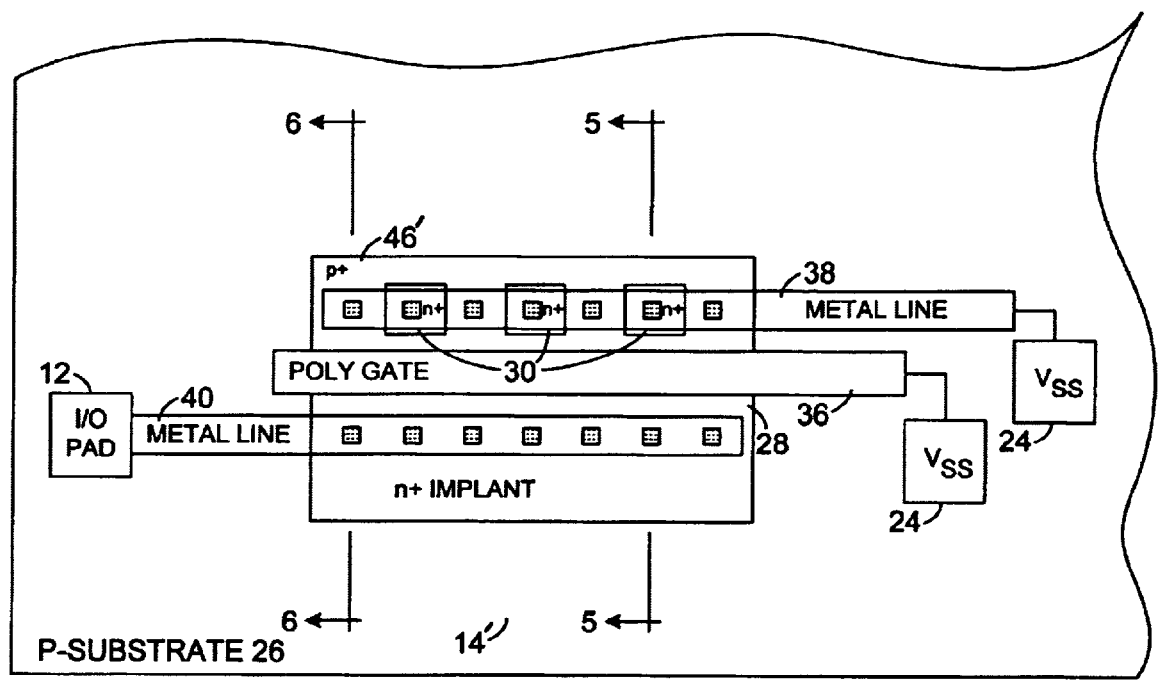
FIG. 4 is a diagrammatic and schematic layout diagram of a second, preferred embodiment according to the present invention.

FIG. 4 shows a second preferred embodiment according to the invention. Grounded-gate FET 14' is similar to that shown in FIG. 3, except that the tap region 46 is a generally annular shaped tap region 46' that surrounds a plurality of source subregions 30. As with the embodiment illustrated in FIG. 3, tap region 46' locally ties the p-type substrate 26 in the vicinity of n$^+$ source 30 to the $V_{ss}$ bus 24. In-effect, the substrate connection provided by p$^+$ tap connection 46', which completely surrounds the n$^+$ source subregions 30, reduces the chance of substrate "noise" from turning on the intrinsic lateral npn transistor inadvertently, particularly during customer programming operations. That is, to turn on the intrinsic npn device, its base-emitter junction must be forward biased. Inasmuch as its base (i.e., p-type substrate 26 by way of tap 46') and emitter (n⁺ source 30) are locally tied to the same voltage (e.g., preferably, $V_{ss}$), adverse effects of substrate noise are suppressed or inhibited such that it is unlikely that the base-emitter bias $V_{be}$ would increase to a high enough level to turn on the intrinsic bipolar device. The likelihood of damage due to EOS is therefore substantially minimized.

FIG. 5 is a cross-sectional view of the second preferred embodiment illustrated in FIG. 4, taken substantially along lines 5—5. Specifically, FIG. 5 shows an important aspect of the present invention, namely, p⁺ tap region 46' being disposed between source 30 and channel region 32 underlying gate 36. This placement greatly reduces the ability of the parasitic lateral npn bipolar transistor to switch on inadvertently and cause undesirable damage to the semiconductor device especially during application of $V_{pp}$ to I/O pad 12.

FIG. 6 is a cross-sectional view of the embodiment shown in FIG. 4, taken substantially along lines 6—6. FIG. 6 shows that in some cross-sections, p⁺ tap 46' displaces n⁺ source 30 entirely.

In yet a further alternative embodiment, tap 46' and source 30 may be reversed relative to the embodiment of FIGS. 4 and 5 such that the cross-section in the vicinity of the source 30 alternates n⁺–p⁺–n⁺ rather than p⁺–n⁺–p⁺ (as actually shown in FIG. 5). This embodiment (not shown) corresponds to "islands" of tap 46. This is a less preferred embodiment, however.

In addition to the foregoing, another advantage of the present invention is that the process of making embodiments in accordance therewith involves the same number of masks and implants as a conventional process, such as a CMOS process. That is, in a preferred embodiment, a p⁺ tap region 46 (or 46') may be implanted at the same time as other p⁺ regions, such as other p⁺ diffusion regions on the same device. Moreover, the contacts 42 that connect p⁺ tap region 46 (or 46') to metal line 38 may be formed at the same time as and/or using the same process that is used to form the contacts 42 connecting n⁺ source region 30 to metal line 38.

Therefore, embodiments in accordance with the present invention may be more cost effective than approaches that may change the process itself, either by adding process steps, or changing the nature or quality of any particular step. Simply stated, the invention may be implemented merely through a layout or mask change.

Figure 7:
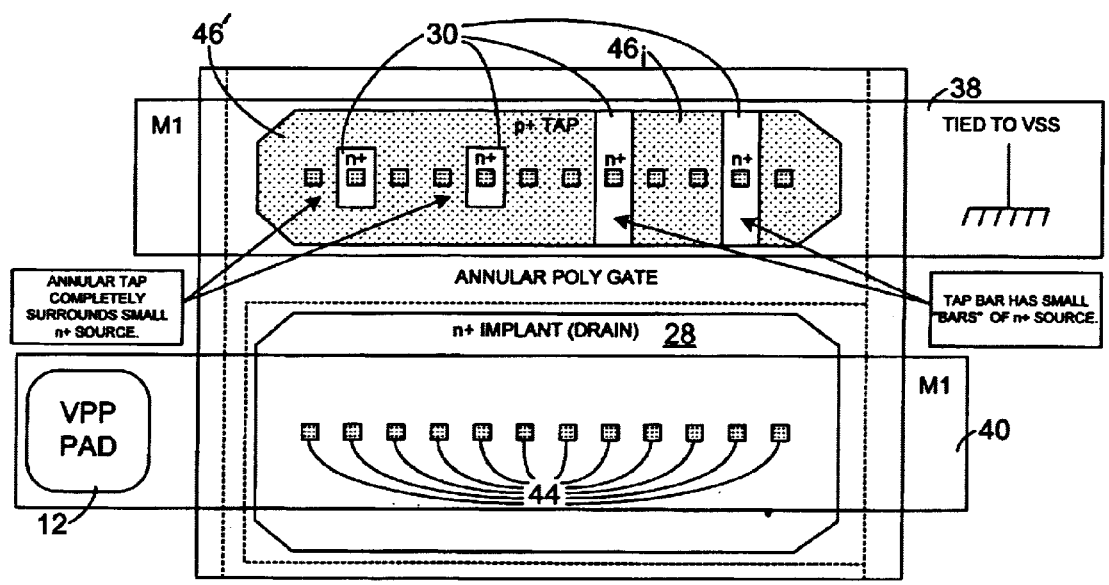
FIG. 7 is a simplified, layout diagram view showing exemplary mask changes for implementing the preferred embodiments of the present invention.

FIG. 7 shows exemplary masks or layouts for the first and second preferred embodiments described herein.

A preferred embodiment in accordance with the present invention which has been described herein has a grounded-gate n-channel FET formed in a p-type substrate 26. However, an embodiment formed in a p-well of an n-type substrate would work equally as well. Although a preferred use of the present invention is in connection with I/O pins used for programming (i.e., those subject to an elevated programming voltage, namely $V_{pp}$), the present invention provides advantages (i.e., improved ability to withstand the effects of substrate/well noise) when used on or in connection with any input, output, and/or input/output pins such, e.g., address pins. A preferred use of the invention is in CMOS memory devices and/or logic circuits that may be electrically programmed (such as EPROMs); however, the improved ability to withstand the effects of noise characterized by the herein described invention may make it desirable for use in many other applications as well.

As indicated above, the processing steps for making a device according to the present invention are conventional, and well known to those of ordinary skill in the art; nonetheless, a brief description of the same follows immediately hereafter. It should be apparent that a p⁺ doping level is greater than a p doping level; likewise, an n⁺ doping level is greater than an n doping level. Preferably, the doping levels satisfy $10^{13}$ cm⁻³ ≤ n ≤ $10^{19}$ cm⁻³, $10^{13}$ cm⁻³ ≤ p ≤ $10^{19}$ cm⁻³, $10^{15}$ cm⁻³ ≤ n⁺ ≤ $10^{21}$ cm⁻³, $10^{15}$ cm⁻³ ≤ p⁺ ≤ $10^{21}$ cm⁻³, more preferably, $10^{15}$ cm⁻³ ≤ n ≤ $10^{18}$ cm⁻³; $10^{15}$ ≤ p ≤ $10^{18}$ cm⁻³; $10^{19}$ cm⁻³ ≤ n⁺ ≤ $10^{21}$ cm⁻³; $10^{19}$ cm⁻³ ≤ p⁺ ≤ $10^{21}$ cm⁻³.

Substrate 26 may typically be a semiconductor material conventionally known to those of ordinary skill in the art. Examples include silicon, gallium arsenide, germanium, gallium nitride, aluminum phosphide, diamond and alloys such as $Si_{1-x}Ge_x$ and $Al_xGa_{1-x}As$, where $0 \leq x \leq 1$. Many others are known, such as those listed in *Semiconductor Device Fundamentals*, on page 4, Table 1.1 (Robert F. Pierret, Addison-Wesley, 1996).

Diffusion regions 28 and 30, which correspond to the drain and source regions, respectively, of grounded-gate FET 14 (and 14') of FIG. 3 (FIGS. 4–6) are formed in accordance with methods known to those of ordinary skill in the art, using materials known to those of ordinary skill in the art for their known purposes. For example, n-type and p-type doping of a semiconductor substrate (which may be light or heavy) may be accomplished by conventional methods known to those of ordinary skill in the art. Dopant species such as arsenic, phosphorus, and boron may be added by well known techniques such as ion implantation and (optionally diffusion). Implantation may be followed by annealing and/or "drive-in" steps to deliver the doping in a desired fashion. Such annealing and drive-in steps may be conducted by conventional methods known to those of ordinary skill in the art. The locations of the source and drain regions may be self-aligned with the gate 36.

Dielectric layer 34 comprises materials known to those of ordinary skill in the art, such as silicon oxide, and can act as a gate oxide, for example of transistor 14 (or 14'), as well as for protecting substrate 26. The thickness of dielectric layer 34 may vary. For example, well-known field oxide (FOX) regions are substantially thicker than a gate oxide thickness. The material used and the relative thickness for dielectric layer 34 are known to those of ordinary skill in the art depending on the desired purpose(s) and/or function(s).

Gate electrode 36 may comprise highly doped polysilicon material. The resistivity of silicon can be controlled over a wide range by varying the concentration of impurities such as phosphorous, boron and/or arsenic. One of ordinary skill in the art is familiar with the amounts and identities of dopants used to provide the gate 36 with its desired properties and/or function(s). Other conductors, however, conventional and well-known to those of ordinary skill in the art, and which have a resistivity on the same order as that of highly doped polysilicon, can also be used for gate 36. Examples include $WSi_x$, Al, W, Ti, Zr, Mo, and alloys thereof (e.g., TiW alloy, or a silicide such as $CoSi_x$, $HfSi_x$, $MoSi_x$, $NiSi_x$, $Pd_2Si$, PtSi, $TaSi_x$, $TiSi_2$, $WSi_x$, $ZrSi_x$ and $CrSi_2$). A p-type or n-type substrate has a level of doping compatible with the n-channel or p-channel transistors formed in the substrates, while an n-well or p-well may be doped to compensate the substrate and to provide the appropriate characteristics for the transistors formed in such a well.

Metal lines 38 and 40 typically comprise aluminum or an aluminum alloy, but virtually any metallic electrical conductor (e.g., copper, alloys of copper and aluminum, etc.) can be used. A metallic conductor typically has a resistivity of $10^{-2}$ ohm-cm or less. The metal layer or bus may further comprise wetting, protective, adhesive and/or barrier layers (e.g., titanium, tungsten, and alloys thereof) between it and adjacent materials and/or layers.

Contacts 42 and 44 may be formed by conventional methods known to those of ordinary skill in the art. Examples of suitable contact materials include metals such as aluminum, titanium, zirconium, chromium, molybdenum, tungsten or alloys thereof (e.g., TiW). When the contact is aluminum, alloying of the aluminum with silicon may be conducted to reduce dissolution of source and drain silicon into the aluminum.

The present invention provides substantial improvements and resistance of semiconductor devices to catastrophic failure during programming operations. In constructed embodiments corresponding to FIGS. 3 and 4, the improvement occasioned by the present invention increased yield between about 10–20% over conventional structures (i.e., fewer discards based on a failure during a $V_{pp}$ tester program).

While the invention has been particularly shown and described with reference to the preferred embodiments thereof, it is well understood by those skill in the art the various changes and modifications can be made in the invention without departing from the spirit and scope thereof.

What is claimed is:

1. An interface structure comprising:
    a transistor formed in a first region of a first conductivity type, said transistor having a gate, a first source/drain region having a second conductivity type opposite said first conductivity type, and a second source/drain region having said second conductivity type, said first and second source/drain regions each comprising a plurality of contacts; and
    a tap region of said first conductivity type adjacent to and surrounding a selected group of said plurality of contacts and configured to increase a snapback threshold of said transistor, wherein (i) said selected group of contacts is less than half of said plurality of contacts, (ii) said tap region is adjacent to and aligned with an edge of said gate and (iii) said first region and said tap region are electrically connected to a common node.

2. The structure of claim 1, wherein said first and second source/drain regions are spaced apart to define a channel region therebetween, said structure further including a layer of dielectric material formed over at least said channel region, said gate being disposed on said dielectric layer overlying said channel region.

3. The structure of claim 2, wherein said first region comprises one of a p-type substrate and a p-type well region.

4. The structure of claim 2, wherein said tap region comprises one or more generally bar shaped subregions.

5. The structure of claim 2, wherein said tap region is generally annular in shape and surrounds said selected group of contacts.

6. The structure of claim 5, wherein a portion of said tap region is disposed between said channel region underlying said gate electrode and said selected group of contacts.

7. The structure of claim 2, wherein said tap region comprises one or more subregions surrounded by said selected group of contacts.

8. The structure of claim 2, wherein said first conductivity type is p-type and said second conductivity type is n-type, and said common node is coupled to a substantially ground potential.

9. The structure of claim 2, wherein said tap region has a greater conductivity than said first region.

10. An electrostatic discharge (ESD) protection device, comprising:
    a transistor formed in a first region having a p-type conductivity, said transistor having a first and a second n-type conductivity source/drain region spaced apart to define a channel region therebetween, said first and second n-type conductivity source/drain regions each comprising a plurality of contacts;
    a p-type conductivity tap region adjacent to and surrounding a selected group of said plurality of contacts and configured to increase a snapback threshold of said transistor, wherein said selected group of contacts is less than half said plurality of contacts; and
    a gate overlying said channel region, wherein said first region and said tap region are electrically connected to a common node and said tap region is adjacent to and aligned with an edge of said gate.

11. The ESD device of claim 10, wherein:
    said first or second n-type conductivity source/drain region comprise a plurality of source subregions, and said tap region comprises a plurality of generally bar shaped subregions disposed in parallel relation to said source subregions.

12. The ESD device of claim 10, wherein said tap region is generally annular in shape and surrounds said selected group of contacts.

13. The ESD device of claim 12, wherein a portion of said tap region is disposed between said channel region underlying said gate and said source region.

14. The ESD device of claim 10, wherein said tap region comprises one or more subregions surrounded by said source region.

15. An interface circuit of a semiconductor device comprising:
    an interface pad;
    a transistor formed in a first region having a first conductivity type, said transistor having a gate, a source region having a second conductivity type opposite said first conductivity type, and a drain region having said second conductivity type, said source and said drain regions each comprising a plurality of contacts; and
    a tap region of said first conductivity type adjacent to and surrounding a selected group of said plurality of contacts and configured to increase a snapback threshold of said transistor, wherein (i) said selected group of contacts is less than half of said plurality of contacts, (ii) said tap region is adjacent to and aligned with an edge of said gate and (iii) said source region, said first region and said tap region are electrically connected to a common node and either (a) an input buffer or (b) an output buffer coupled to said pad.

16. The circuit of claim 15, wherein said source region and said drain region are spaced apart to define a channel region therebetween, said gate overlying said channel region.

17. The circuit of claim 16, wherein said interface pad is employed in at least one of testing and programming operations of the device.

18. The structure of claim 1, wherein said tap region is disposed between said selected group of contacts and a channel region underlying said gate.

19. The ESD device of claim 10, wherein said tap region is disposed between said selected group of contacts and said channel region, wherein said channel underlies said gate.

20. The circuit of claim 15, wherein said tap region is disposed between said selected group of contacts and a channel region underlying said gate.

21. The structure of claim 1, wherein a distance between a closest edge of said tap region and (a) said selected group of contacts and (b) said gate is selected from the group consisting of (i) at most approximately 0.65 $\mu$m, (ii) at most approximately 0.5 $\mu$m, (iii) at most approximately 0.35 $\mu$m, and (iv) at most approximately 0.18 $\mu$m.

22. The ESD device of claim 10, wherein a distance between a closest edge of said tap region and (a) said selected group of contacts and (b) said gate is selected from the group consisting of (i) at most approximately 0.65 $\mu$m, (ii) at most approximately 0.5 $\mu$m, (iii) at most approximately 0.35 $\mu$m, and (iv) at most approximately 0.18 $\mu$m.

23. The circuit of claim 15, wherein a distance between a closest edge of said tap region and (a) said selected group of contacts and (b) said gate is selected from the group consisting of (i) at most approximately 0.65 $\mu$m, (ii) at most approximately 0.5 $\mu$m, (iii) at most approximately 0.35 $\mu$m, and (iv) at most approximately 0.18 $\mu$m.

* * * * *